United States Patent
Smith et al.

(10) Patent No.: US 10,938,255 B2
(45) Date of Patent: Mar. 2, 2021

(54) WIRELESS POWER TRANSMISSION USING A CAPACITIVE SENSOR

(71) Applicant: Integrated Device Technology, Inc., San Jose, CA (US)

(72) Inventors: Nicholaus Smith, La Mesa, CA (US); Rui Liu, Fremont, CA (US); Tao Qi, San Diego, CA (US); Amit D. Bavisi, Los Gatos, CA (US); Chan Young Jeong, San Jose, CA (US)

(73) Assignee: INTEGRATED DEVICE TECHNOLOGY, INC., San Jose, CA (US)

(*) Notice: Subject to any disclaimer, the term of this patent is extended or adjusted under 35 U.S.C. 154(b) by 54 days.

(21) Appl. No.: 16/368,777

(22) Filed: Mar. 28, 2019

(65) Prior Publication Data

US 2020/0212729 A1    Jul. 2, 2020

Related U.S. Application Data

(60) Provisional application No. 62/787,553, filed on Jan. 2, 2019, provisional application No. 62/786,200, filed on Dec. 28, 2018.

(51) Int. Cl.
| | |
|---|---|
| *H02J 50/90* | (2016.01) |
| *H02J 50/10* | (2016.01) |
| *H03K 17/955* | (2006.01) |
| *H02J 7/02* | (2016.01) |
| *H02J 50/40* | (2016.01) |

(52) U.S. Cl.
CPC .............. *H02J 50/90* (2016.02); *H02J 7/025* (2013.01); *H02J 50/10* (2016.02); *H02J 50/40* (2016.02); *H03K 17/955* (2013.01)

(58) Field of Classification Search
CPC .. H02J 50/90; H02J 50/10; H02J 50/40; H02J 7/025; H03K 17/955
USPC .................................................. 307/104, 130
See application file for complete search history.

(56) References Cited

U.S. PATENT DOCUMENTS

| | | | |
|---|---|---|---|
| 6,150,798 A | 11/2000 | Ferry et al. | |
| 9,377,905 B1* | 6/2016 | Grivna | ..................... G06F 3/044 |
| 2009/0322291 A1 | 12/2009 | Ngo et al. | |
| 2014/0111019 A1 | 4/2014 | Roy et al. | |
| 2014/0111154 A1* | 4/2014 | Roy | ......................... B60L 53/38 |
| | | | 320/108 |
| 2014/0197782 A1 | 7/2014 | Graf et al. | |
| 2015/0160668 A1 | 6/2015 | Pujol et al. | |

(Continued)

*Primary Examiner* — Michael R. Fin
(74) *Attorney, Agent, or Firm* — Haynes and Boone, LLP

(57) ABSTRACT

A capacitor sensor array (or grid) over a wireless power transmission coil can include a first set of lines; a second set of lines intersecting the first set of lines; a first multiplexer coupled to provide a charge (e.g. in the form of a DC voltage) from a voltage source to the first set of lines and provide first signals to detect voltages on each line; and a second multiplexer coupled to provide a charge from the voltage source to the second set of lines and provide second signals to detect voltages on each line, wherein an object positioned with respect to the first set of lines and the second set of lines is located. According to some embodiments, a wireless power receive coil and a rectifier circuit can be used in forming a capacitor sensor, to sense the capacitance between the receive and transmit coils for better alignment between the two coils. Other embodiments are also provided.

17 Claims, 8 Drawing Sheets

(56) References Cited

U.S. PATENT DOCUMENTS

| | | | |
|---|---|---|---|
| 2015/0200601 A1 | 7/2015 | Sagneri et al. | |
| 2015/0364928 A1 | 12/2015 | Yen et al. | |
| 2016/0266663 A1* | 9/2016 | Holsen | G06F 1/3259 |
| 2017/0053737 A1 | 2/2017 | Kurs | |
| 2018/0129234 A1 | 5/2018 | Melgar et al. | |
| 2019/0363588 A1* | 11/2019 | Daetwyler | G01V 3/101 |
| 2019/0393732 A1* | 12/2019 | Oshima | G01V 3/10 |

\* cited by examiner $C = \varepsilon A/z$
C = Capacitance
A = Area (Length x Width)
z = Distance to 'Adjacent Plate'
$\varepsilon$ = Dielectric Properties (Air, Case, Covers, Etc.)

WIRELESS POWER TRANSMISSION USING A CAPACITIVE SENSOR

CROSS REFERENCE TO RELATED APPLICATIONS

The present application claims priority to U.S. provisional patent application No. 62/787,553, filed on Jan. 2, 2019, incorporated herein by reference, and U.S. provisional patent application No. 62/786,200, filed on Dec. 28, 2018, incorporated herein by reference.

TECHNICAL FIELD

Embodiments of the present invention are related to wireless transmission of power and, in particular, to a capacitive sensor associated with the wireless power transmission.

DISCUSSION OF RELATED ART

Mobile devices, for example smart phones, tablets, wearables and other devices are increasingly using wireless power charging systems. In general, wireless power transfer involves a transmitter driving a transmit coil and a receiver with a receiver coil placed proximate to the transmit coil. The receiver coil receives the wireless power generated by the transmit coil and uses that received power to drive a load, for example to provide power to a battery charger.

There are multiple different standards currently in use for the wireless transfer of power. The more common standards for wireless transmission of power include the Alliance for Wireless Power (A4WP) standard and the Wireless Power Consortium standard, the Qi Standard. Under the Wireless Power Consortium, the Qi specification, a resonant inductive coupling system is utilized to charge a single device at the resonance frequency of the receiver coil circuit. In the Qi standard, the receiving device coil is placed in close proximity with the transmission coil while in the A4WP standard, the receiving device coil is placed near the transmitting coil, potentially along with other receiving coils that belong to other charging devices. Either wireless power protocol or additional variations can include combinations of charging methods (i.e., one transmitter to one receiver, or one transmitter to multiple receivers).

Typically, a wireless power system includes a transmitter coil that is driven to produce a time-varying magnetic field and a receiver coil, which can be part of a device such as a cell phone, PDA, computer, or other device, that is positioned relative to the transmitter coil to receive the power transmitted in the time-varying magnetic field.

Ongoing issues with respect to wireless power transmission is the alignment of receive coils with the transmission coil and locating foreign objects adjacent to the wireless power transmitter.

Therefore, there is a need to develop better systems for locating alignment between the wireless power transmission coil and the receive coil as well as for location of foreign objects.

SUMMARY

According to some embodiments, a capacitor sensor that can be used over a wireless power transmission coil is presented. In some embodiments, a capacitor sensor can include a first set of lines; a second set of lines intersecting the first set of lines; a first multiplexer coupled to the first set of lines, the first multiplexer configured to provide a charge from a battery to the first set of lines and provide first signals to a first ADC sample and hold to detect voltages on each line of the first set of lines; and a second multiplexer coupled to the second set of lines, the second multiplexer configured to provide a charge from the battery to the second set of lines and provide second signals to a second ADC sample and hold to detect voltages on each line of the second set of lines, wherein an object positioned with respect to the first set of lines and the second set of lines is located.

According to some embodiments, a capacitor sensor can be part of a receiver or a transmitter. In some embodiments, the capacitor sensor uses the receive coil and rectifier circuitry. In power transfer operation, the rectifier circuitry rectifies the AC signal in the receive coil, and provides a rectified voltage on an output terminal. But in order to align the receive coil to the transmit coil, the receive coil and rectifier circuitry operation is reversed: the output terminal becomes an input receiving a DC voltage, and the rectifier circuitry couples the DC voltage to the receive coil. Then the voltage change on the receive coil is monitored to detect a current through the capacitor formed by the receive and transmit coils. The voltage change is used to detect the presence of the transmit coil, and to align the two coils for optimal power transfer. The alignment can be achieved by maximizing the receive coil capacitance.

These and other embodiments are discussed below with respect to the following figures.

These figures are further discussed below.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description illustrates inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention.

Figure 1A:
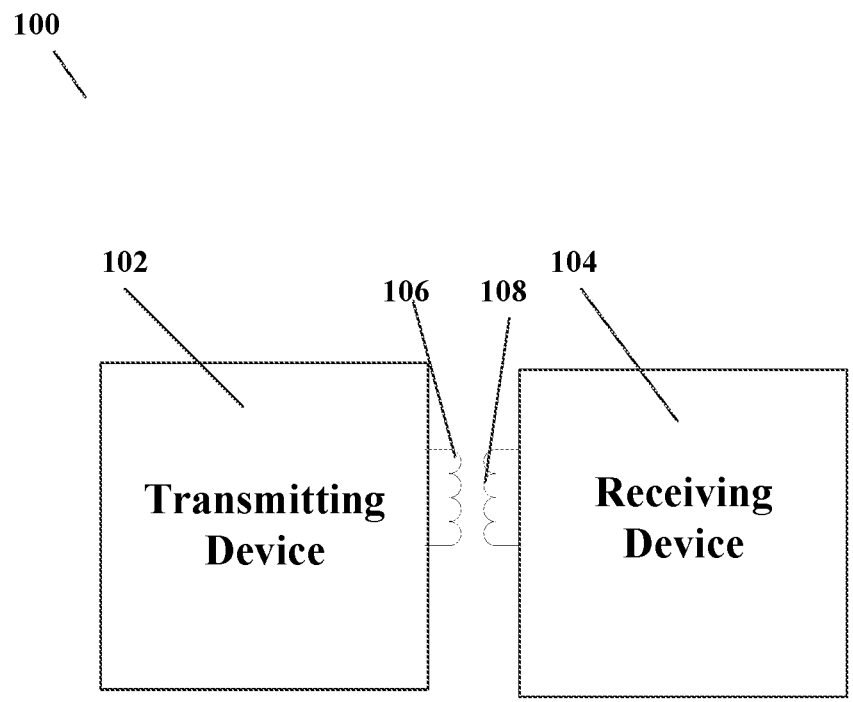
FIG. 1A illustrates a wireless power system.

FIG. 1A illustrates an example wireless power transmission system 100. As illustrated in FIG. 1A, a transmitting device 102 is coupled to drive a transmission coil 106 to produce a time varying magnetic field. The time varying magnetic field induces a current in receive coil 108. Receive coil 108 is coupled to receiving device 104, which receives the transmitted wireless power. However, it is difficult to detect the difference between foreign objects and a mis-aligned receive coil 108, e.g. mis-alignment of device 102 (a mobile phone or some other type of device).

Figure 1B:
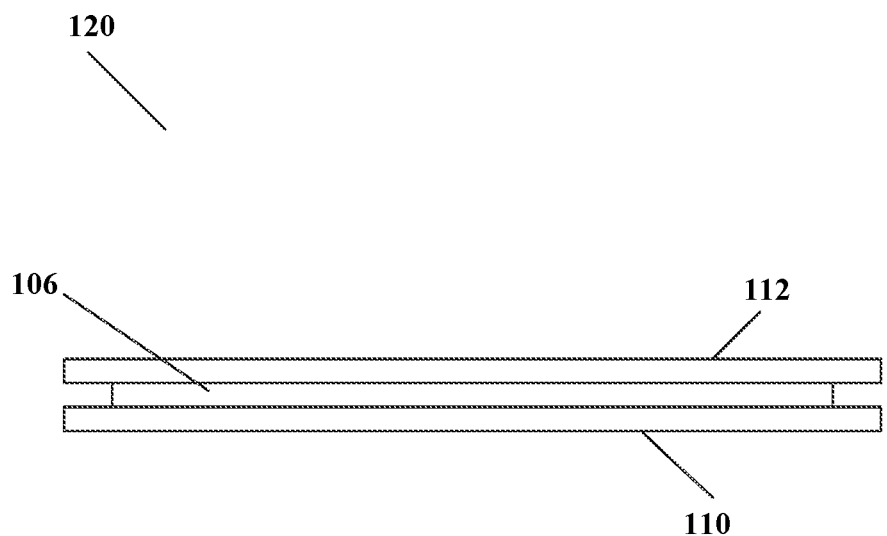
FIG. 1B illustrates a transmitter assembly with a capacitive sensor according to some embodiments.

FIG. 1B illustrates a transmission coil assembly 120 according to some embodiments. As illustrated in FIG. 1B, transmission coil 106 can be mounted on a substrate 110. A capacitive sensor 112 can be mounted over transmission coil 106. Capacitive sensor 112 can be used to identify object size and location of receiving device 104 or of a foreign object, or the presence of device 104 or foreign object on the surface of transmission coil assembly 120.

Previous attempts at identifying foreign objects include monitoring power loss or Q-factor measurements, for example. Alignment issues can be helped with forced mechanical alignment of receive device 104 with transmitting device 102.

However, in accordance with embodiments of the present invention, a conductive grid array 112 may be placed above transmit coil 106. Conductive grid array 112 can be used for object detection, object location, and size sensing. Additionally, in some embodiments, conductive grid array 112 can provide an electromotive interference comb filter to reduce radiated emission from transmission coil 106.

Figure 2:
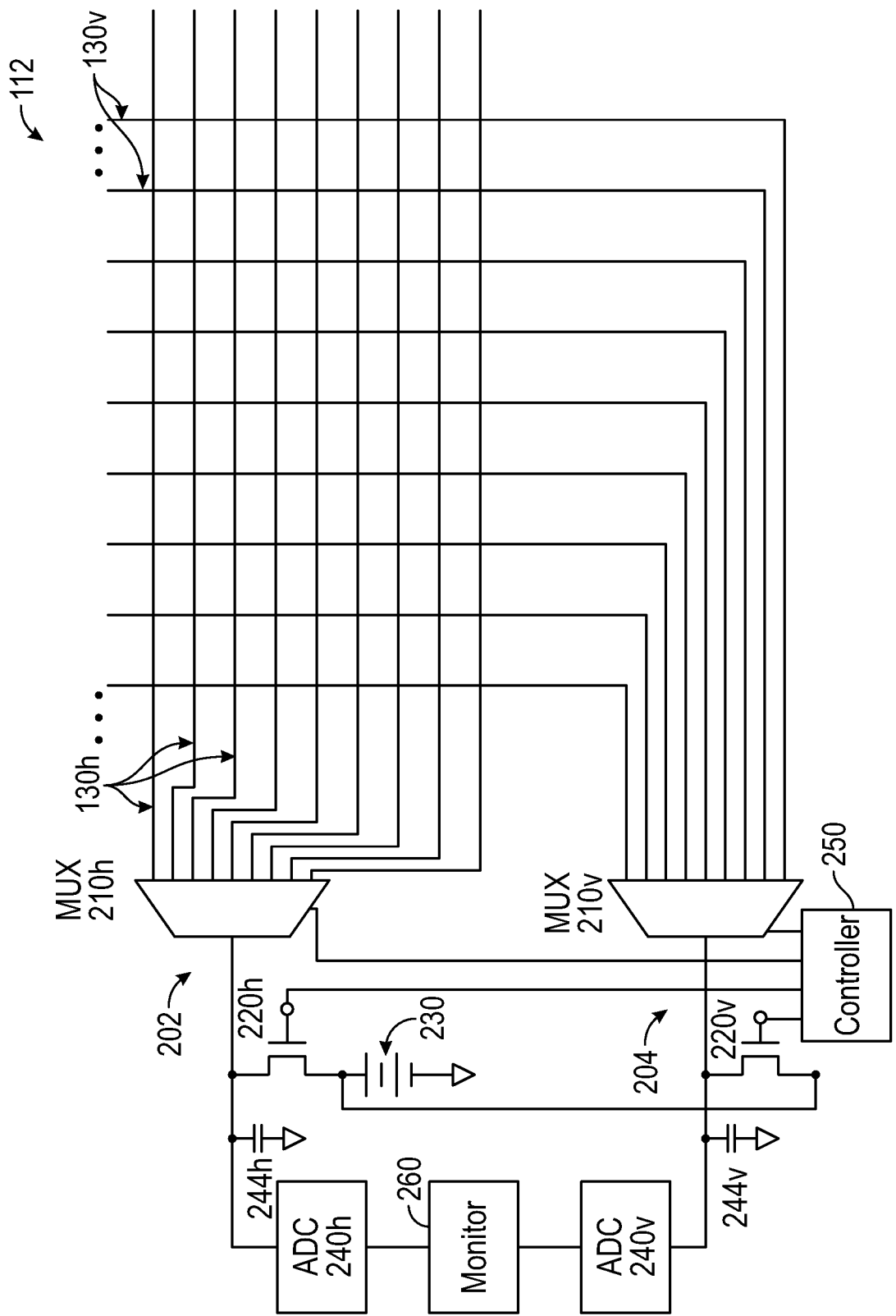
FIGS. 2 and 3 illustrate example capacitive sensors for transmitter assemblies.

FIG. 2 illustrates a grid array 112 and circuitry 202 and 204 for driving grid array 112. As illustrated, the grid array includes horizontal lines 130h and vertical lines 130v (the lines 130 are illustrated in top view, and designation of horizontal and vertical is arbitrary and only refers to a grid formed by two sets of lines that are orthogonal to each other). As illustrated in FIG. 2, a capacitive sensor is formed with thin PCB traces 130h, 130v in a grid array pattern (substrate 110 can be a PCB, i.e. printed circuit board, or some other type of substrate). Analog multiplexers 210h and 210v, or other methods, can be used to apply known voltages to each line 130 (i.e. 130h, 130v) of the grid individually. Sample and hold techniques with an analog-to-digital converter (ADC 240h, 240v, which can be two converters or a single converter) can then be used to monitor the rate of decay on each line one at a time. A voltage drop beyond typical indicates a metallic object is above that particular line.

As illustrated in FIG. 2, circuit 202 can include an analog multiplexer 210h coupled to the horizontal lines 130h, and a transistor 220h coupled to the multiplexer output, to charge the horizontal line 130h selected by the multiplexer to the voltage of battery 230. The multiplexer output can also be coupled to an ADC sample and hold circuit, including an ADC (analog to digital converter) 240h and a capacitor 244h connected to ground (or another reference voltage), to sample the voltages on the horizontal lines.

Similarly, circuit 204 includes an analog multiplexer 210v coupled to vertical lines 130v, an a transistor 220v coupled to the MUX output, to charge the vertical line 130v selected by the multiplexer to the voltage of battery 230 (or some other regulated voltage source used to apply a fixed known voltage to each line). The multiplexer output is further coupled to an ADC sample and hold circuit, including ADC 240v and a capacitor 244v connected to ground (or another reference voltage), to sample the voltages on the vertical lines.

Consequently, circuits 202 and 204 can use the multiplexers to cycle through and charge each of the horizontal and vertical lines of the grid. Specifically, controller 250 turns on transistor 220h and causes MUX 210h to select a line 130h to charge the line to the battery 230 voltage. Similarly, controller 250 turns on transistor 220v and causes MUX 210v to select a line 130v to charge the line to the battery 230 voltage. Once charged, the voltages on those lines can be monitored one at a time, or two at a time (one horizontal and one vertical line), by a monitor 260 connected to the outputs of ADCs 240, and the drop in voltage can be monitored over time. As discussed above, if the voltage on a line drops faster than a threshold rate (e.g. than voltages on other lines), or at a particular time the voltage is below a particular threshold (e.g. the threshold set by voltages on other lines), then the line is proximate to an object, and thus the object location is determined. The size and location of the object can be determined by compiling the data on each of the horizontal and vertical lines 130.

Figure 3:
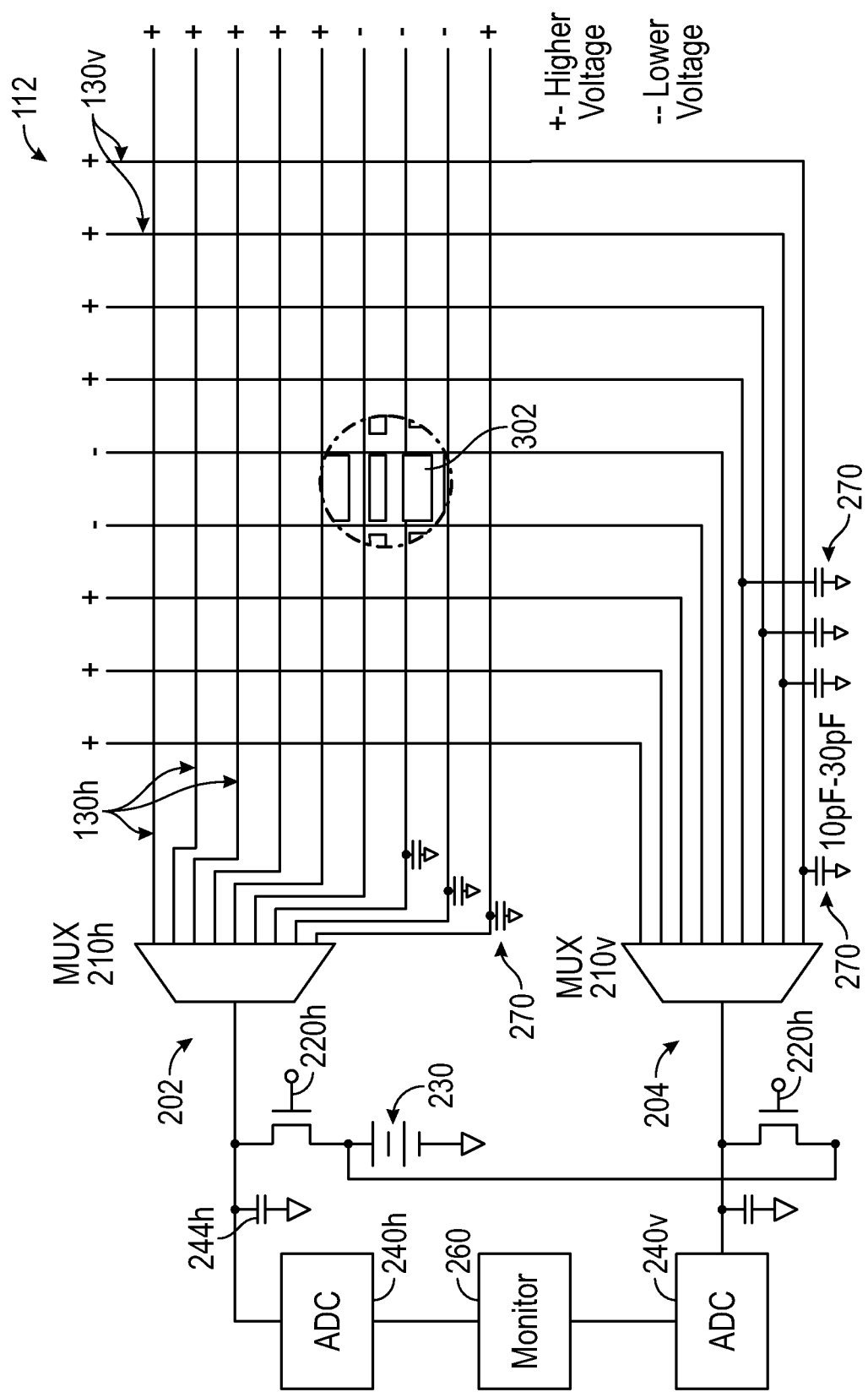

FIG. 3 illustrates operation when an object 302 is placed over capacitive sensor 112. (Controller 250 and some other features are omitted in FIG. 3 for simplicity sake.) Object 302 can be a device to be charged, e.g. a mobile phone, or a receive coil, or can be a foreign, metallic object. With object 302 placed over sensor 112, a capacitor is formed between the thin traces 130 (one plate of the capacitor) and metallic object 302. When an E-field is generated by charging the lines 130, a charge is transferred from the lines to the metallic object when the object is in close proximity. This results in a voltage change on the affected lines, as indicated:

$$dV = i_c dt/C,$$

where dV is the voltage change, $i_c$ is the capacitive current resulting from the electric-field loss to the object 302, dt is a unit of time, and C is the effective capacitance between the lines and object 302.

When object 302 is therefore nearby, the E-field will decay the voltage faster on lines 130 near the object. Therefore, the object and its size can be detected based on which of the lines 130 are losing voltage at a faster rate. Consequently, sampling the voltages on each line after a unit of time will yield about a 0V change where object 302 is not present and a negative voltage change where object 302 is present. This is illustrated in FIG. 3 by the "+" and "−" associated with each line depending on whether the line passes proximate to object 302.

As is further illustrated in FIG. 3, in some embodiments a capacitor 270 is coupled to each line to store charge. These capacitances (e.g. 10 pF to 30 pF per line in some embodiments) may depend on the multiplexer parasitic capacitors and select/deselect speeds.

By storing charge on each tine of the grid array of capacitive sensor 112 and then sampling the rate of voltage decay, object position, distance and size can be detected with reasonable accuracy. With this information the alignment of the phone, or foreign object location, can be detected. By charging the lines 130 quickly and then checking for voltage decay one at a time, the voltage decays on the line can indicate when an object is above them. With a grid pattern we can find the location.

One skilled in the art will recognize that capacitive sensor 112 can include patterns other than a grid pattern. Further, additional circuitry can be included so that multiple lines 130h in the horizontal direction and multiple lines 130v in the vertical direction can be charged and sampled simultaneously. Although the additional circuitry can improve the response time of sensor array 112, it increases the circuitry required.

Figure 4:
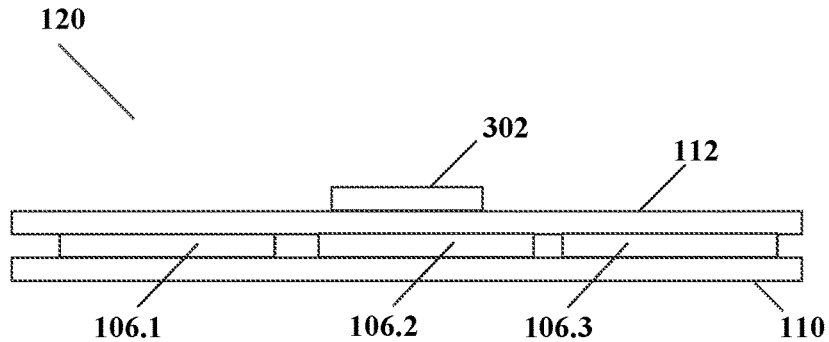
FIG. 4 illustrates an example of a transmitter assembly with a capacitive sensor according to some embodiments.

Several applications are apparent for a capacitive sensor such as capacitive sensor 112. For example, capacitive sensor 112 can detect edges and hence the size, shape and position of ferrous objects for alignment observation. In some systems, FOD (foreign object detection) settings can be adjusted based on placement position of objects. For example, FIG. 4 shows a transmitter assembly 120 with three transmission coils 106.1, 106.2, 106.3. Capacitive sensor 112 (same as in FIGS. 2, 3) is mounted over the three transmission coils. Capacitive sensor 112 senses an object 302 over coil 106.2 but not over coils 106.1, 106.3. If transmitter 120 determines that the object 302 is a device to be charged (this can be determined, for example, from the size or shape of object 302, or by transmitter 120 attempting to wirelessly communicate with object 302 through coil 160.2 used as an antenna, or by transmitter 120 receiving a user command), transmitter 120 starts wireless power transfer via coil 106.2; the other two coils are inactive. If transmitter 120 determines that object 302 is a foreign object, transmitter 120 does not start power transfer, and may generate an alert signal. Further, if power transfer was in progress, the transfer can be shut off until the object is removed.

Furthermore, the horizontal or vertical lines can be grounded during wireless power transmission to create an EMI comb filter shield.

Figure 5:
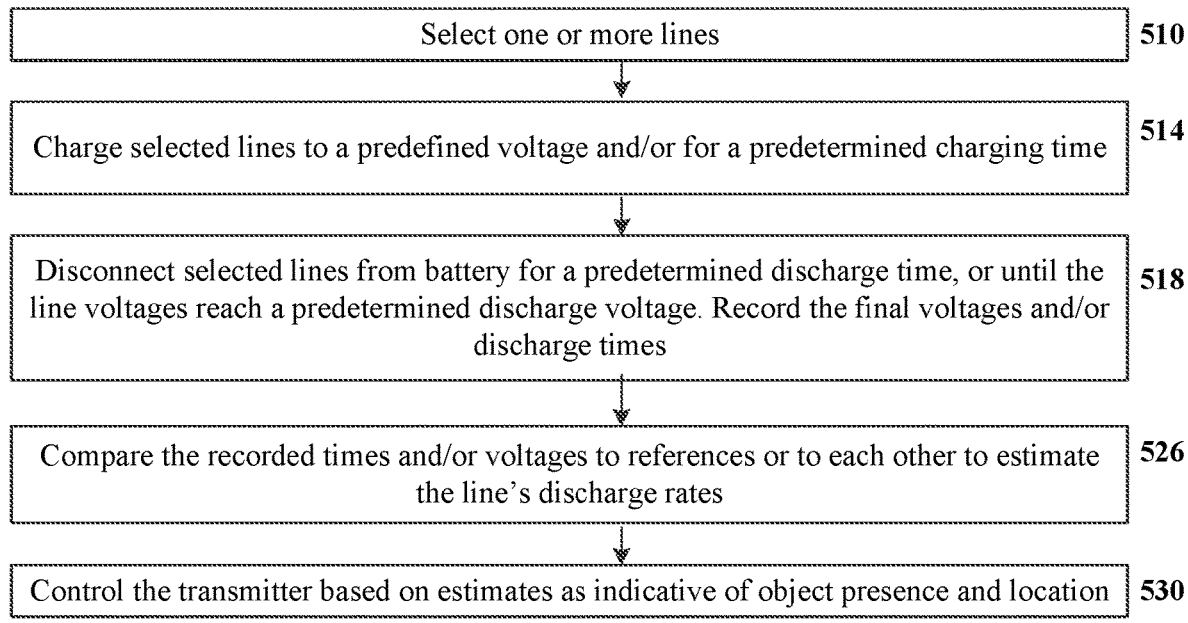
FIG. 5 is a flowchart of an example of transmitter operation using a capacitive sensor according to some embodiments.

FIG. 5 is a flowchart of transmitter operation according to some embodiments. At step 510, the multiplexer(s) 210 select one or more lines 130. At step 514, the selected lines are connected to battery 230 via transistor(s) 220 for a predetermined charging time, or until the lines reach a predetermined charging voltage. At step 518, the lines are disconnected from the battery for a predetermined discharge time, or until the lines reach a predetermined discharge voltage. For each line, record the final voltages reached in the discharge time, or the times taken by the lines to reach the discharge voltage. These recorded values can be measured by the monitoring circuit including ADCs 240 and monitor 260, or some other suitable monitoring circuit. The recorded values can be recorded in a suitable computer-readable memory (e.g. a semiconductor register). Monitor 260 may include a microcontroller.

The above steps can be repeated until all the lines have been selected. Alternatively, these steps can be performed only for some of the lines, i.e. the lines overlying a single one of transmission coils 106 if there are multiple transmission coils.

At step 530, a transmitter control action is taken based on the recorded values as described above. For example, if a foreign object is detected over an operating transmission coil, the coil is shut off.

Figure 6:
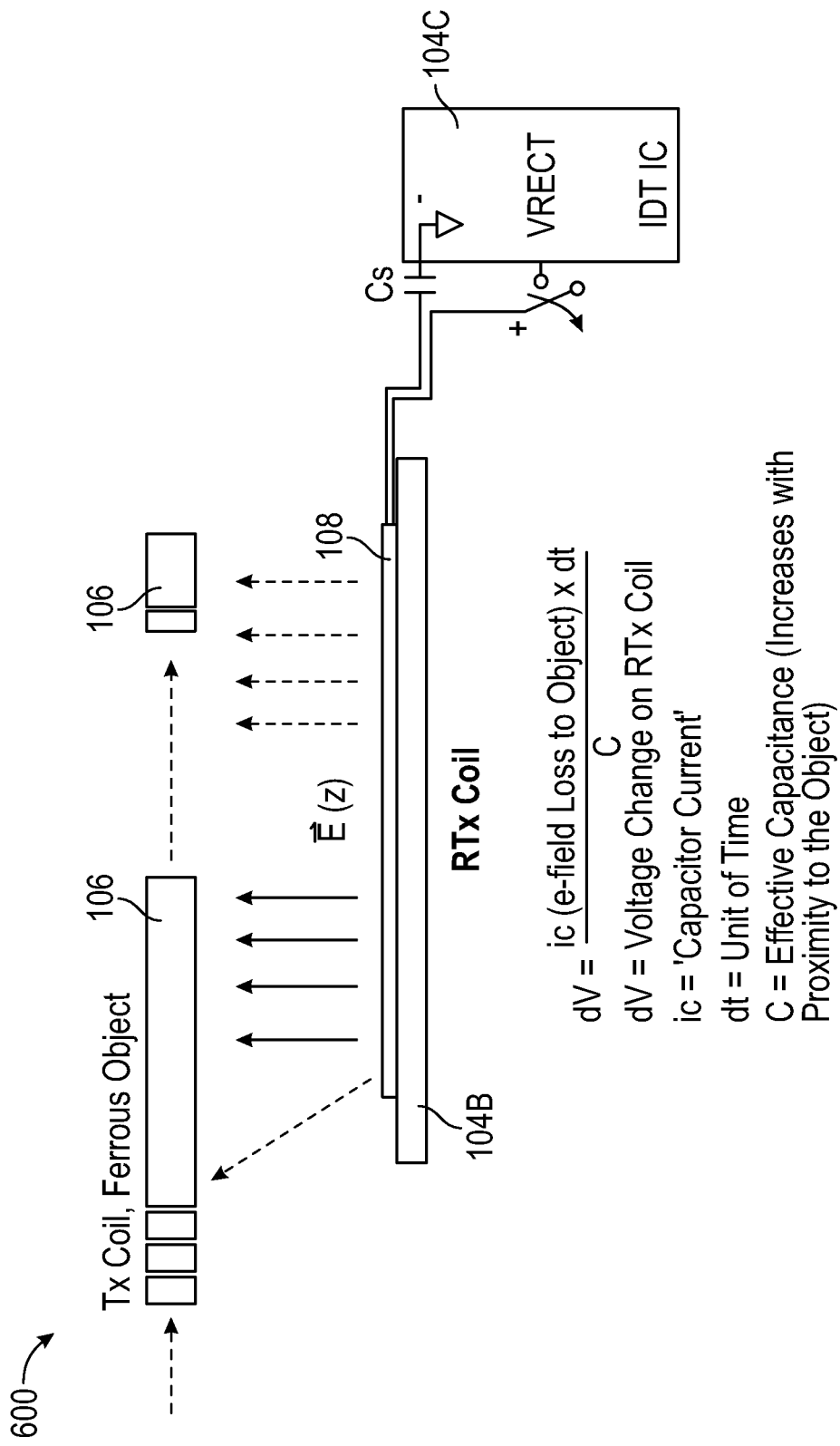
FIG. 6 illustrates capacitance between a transmit coil and a receive coil.

In some embodiments, lines 130 may or may not be present, and the capacitance sensing can be performed by the receiving device 104 rather than (or in addition to) the transmitter. Receiver 104 can sense the capacitance between receive coil 108 and the transmitter, to help align the receive coil 108 for optimal power transfer. FIG. 6 illustrates a configuration 600 of transmit coil 106 positioned with respect to receive coil 108. Receiver coil 108 is coupled to a driver IC 104C that can include rectifier circuits providing a rectified voltage VRECT generated from the receiver coil current. Driver 104C may also include a circuit to monitor the voltage on receiver coil 108 as needed for the optimal capacitive coupling to transmit coil 106. The voltage V on receiver coil satisfies the relationship $$dV = \frac{i_c dt}{C} \quad (1)$$

where dV is the voltage change on receive coil 108, $i_c$ is the "capacitor current" that reflects the e-field loss between receive coil 108 and transmission coil 106, and C is the effective capacitance, which increases with proximity and alignment to transmission coil 106. Although FIG. 6 illustrates monitoring of the capacitance of receive coil 108 with respect to transmission coil 106, the capacitance of receiver coil 108 can be monitored by monitoring the voltage changes as any metallic object is provided close to receive coil 108.

The voltage on the receive coil can be monitored using any suitable techniques, including possibly the techniques described above in connection with FIGS. 2 and 3. As non-limiting examples, such techniques may include use of ADC and/or analog circuitry to monitor the receive coil discharge rate. In particular, the discharge rate can be monitored by sensing that the voltage on the receive coil drops faster than usual (based on history); or by sensing that the receive coil voltage at a particular time is below a particular threshold. Such sensing can be accomplished using digital or analog circuitry, including a time-to-digital converter, and/or a delay line, to sense the time of the receive coil voltage reaching a threshold, and/or a comparator, and/or some other circuitry.

Figure 7A:
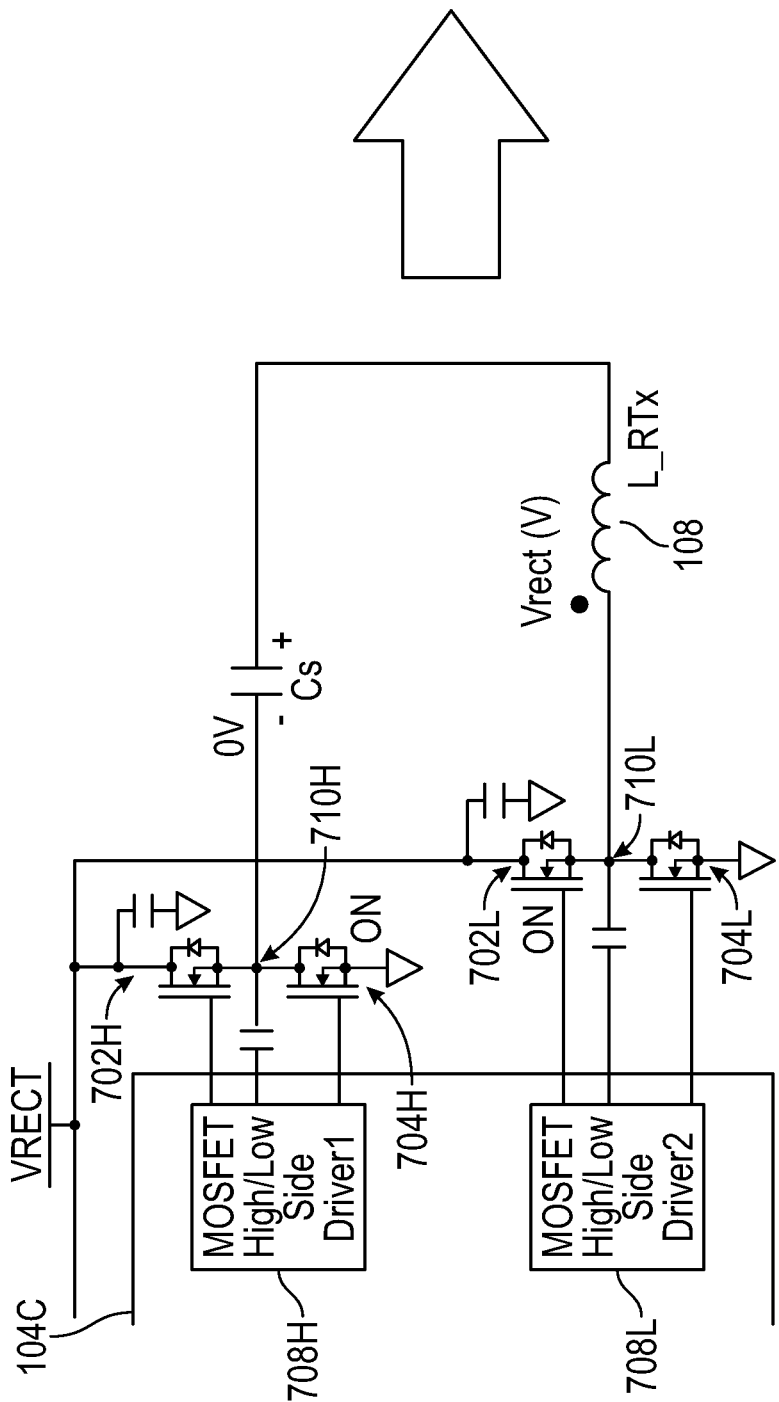
FIGS. 7A and 7B illustrate a receive coil configuration.
Figure 7B:
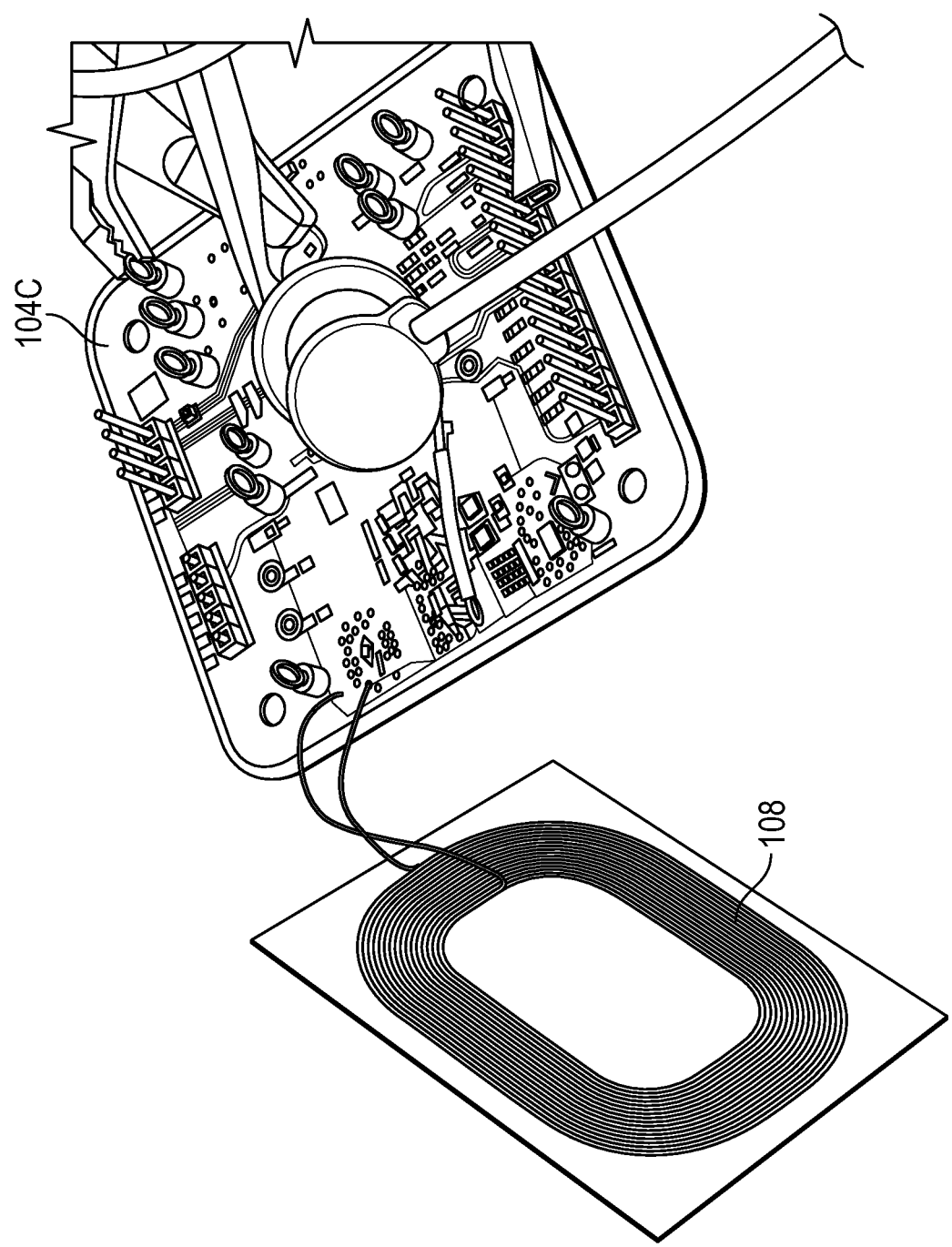

FIGS. 7A and 7B illustrate control circuit 104C coupled to receive coil 108. FIG. 7A illustrate the schematic while FIG. 7B illustrates receive coil 108 and a circuit board 104B with control circuit 104C included. As discussed with respect to FIG. 6, the voltage on receive coil 108 can be monitored to capacitively detect the presence of a transmit coil or other object.

In the embodiment of FIG. 7A, receive coil 108 is connected to a synchronous rectifier including PMOS transistors 702H, 704H, 702L, 704L driven by drivers 708H, 708L. Specifically, one end of receive coil 108 is connected to a node 710L between serially connected transistors 702L, 704L. Node 710L is connected through a capacitor to MOSFET Driver 708L which drives transistors 702L, 704L. Similarly, the other end of receive coil 108 is connected, through capacitor Cs, to node 710H between serially connected transistors 702H, 704H. This node is connected through a capacitor to MOSFET Driver 708H which drives transistors 702H, 704H. Node VRECT, providing the rectified voltage, is connected to the sources of transistors 702H, 702L.

In power transfer operation, node VRECT provides the rectified voltage generated by the rectifier. But before the power transfer, node VRECT can be connected to a DC power source (possibly an external source, not shown) to apply a DC voltage V to receive coil 108 and monitor the voltage change dV in the receive coil. (The entire coil is forced to be at the same voltage at any given time during this operation, i.e. the voltage across the coil is 0V.) The DC voltage is applied by causing MOSFET drivers 708 (i.e. 708H, 708L) to turn on the transistors 704H, 702L, and to turn off the transistors 702H, 704L. The receive coil voltage can be used to estimate the capacitance C based on relationship (1).

Figure 8A:
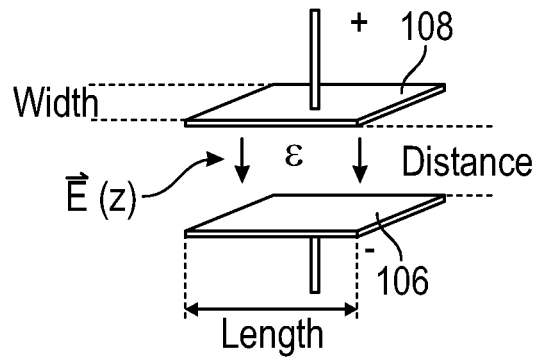
FIGS. 8A and 8B illustrate capacitance detection operation using a receive coil.
Figure 8B:
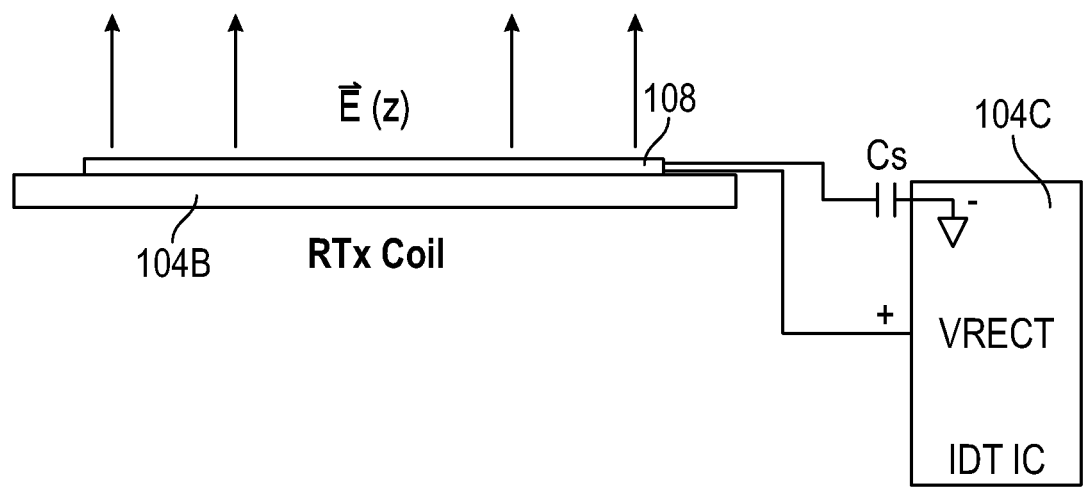

FIGS. 8A and 8B illustrate monitoring of the capacitance in receive coil 108 by monitoring the voltage change dV. As illustrated in FIG. 8B, the receive coil 108 can be formed on a circuit board 104B and coupled to control system 104C. Control system 104C can couple a voltage across the combination of receive coil 108 and receive capacitor Cs. As illustrated in FIG. 8A, the capacitance between receive coil 108 and a corresponding transmission coil 106 is given by $C=\varepsilon A/z$, where C is the capacitance, A is the overlapping area covered by receive coil 108 and transmit coil 106, z is the distance between the two coils, and c is the dielectric constant of the material(s) between receive coil 108 and transmit coil 106 (air, case, covers, etc.). In particular, receive coil 108 can be positioned at a particular distance z in a lateral position that maximizes the capacitance.

Some embodiments of the present invention are defined by the following clauses. These clauses are not claims. The claims are provided below after the clauses.

Clause 1 defines a capacitor sensor positioned over a transmission coil, the capacitor sensor comprising:
 a first set of lines;
 a second set of lines intersecting the first set of lines;
 a first multiplexer coupled to the first set of lines, the first multiplexer configured to provide a charge from a battery to the first set of lines and provide first signals to a first ADC sample and hold to detect voltages on each line of the first set of lines; and
 a second multiplexer coupled to the second set of lines, the second multiplexer configured to provide a charge from the battery to the second set of lines and provide second signals to a second ADC sample and hold to detect voltages on each line of the second set of lines,
 wherein an object positioned with respect to the first set of lines and the second set of lines is located.

2. The capacitor sensor of clause 1, wherein the first set of lines and the second set of lines form a grid array.

3. A wireless power transmitter comprising:
 one or more transmission coils;
 a capacitor sensor positioned over the one or more transmission coils and comprising:
  first lines;
  second lines intersecting the first lines;
  a multiplexer circuit coupled to the first and second lines, the multiplexer circuit configured to provide a charge from a charge source to lines selected by the multiplexer circuit (e.g. the multiplexer circuit could be 210h and 210v; or the two multiplexers can be replaced by a single MUX, with a single output coupled to an ADC or other circuit to monitor a single line at a time; or there could be many multiplexers, each connected to a group of lines 130, and the multiplexer outputs could be monitored in parallel, or could be held by sample-and-holds and monitored one after another); and
  a monitor circuit (e.g. ADCs 240, possibly with monitor 260) for monitoring a rate of discharge of each of the first and second lines, the rate of discharge of each line depending on a presence of an object proximate to the line and on a charge transfer between the line and the object (for example, the discharge rate can be monitored by sensing that the voltage on a line drops faster than a threshold rate, or than a voltage on other lines; or by sensing that the line voltage at a particular time is below a particular threshold or below voltages on other lines; such sensing can be accomplished using digital or analog circuitry, including a time-to-digital converter, and/or a delay line, to sense the time of the line's voltage reaching a threshold, and/or a comparator, and/or some other circuitry);
 wherein the power transmitter is responsive to the monitor circuit in power transmission.

4. The wireless power transmitter of clause 3, wherein monitoring the rate of discharge of each line by the monitor circuit comprises determining whether the line's voltage has reached a threshold after a predetermined length of time.

5. The wireless power transmitter of clause 3, wherein monitoring the rate of discharge of each line by the monitor circuit comprises comparing the line's voltage with other lines' voltages after each line was discharging for a predetermined length of time.

6. The wireless power transmitter of clause 3, wherein monitoring the rate of discharge of each line by the monitor circuit comprises determining a length of time taken by the line's voltage to reach a predetermined value.

7. The wireless power transmitter of clause 3, wherein monitoring the rate of discharge of each line by the monitor circuit comprises comparing a length of time taken by the line's voltage to reach a predetermined value with lengths of time taken by other lines' voltages to reach the predetermined value.

8. The wireless power transmitter of any one of clauses 3 through 7, wherein the multiplexer circuit comprises:
 a first multiplexer (e.g. 210h) coupled to the first lines, to provide a charge from the charge source to the first lines selected by the first multiplexer and to couple selected first lines to the monitor circuit; and
 a second multiplexer (e.g. 210v) coupled to the second lines, to provide a charge from the charge source to the second lines selected by the second multiplexer and to couple selected second lines to the monitor circuit.

9. The wireless power transmitter of any one of clauses 3 through 8, configured to ground the first lines during power transfer.

10. The wireless power transmitter of any one of clauses 3 through 9, comprising a plurality of the transmission coils, wherein the transmitter is configured to perform power transfer by operating a transmission coil over which an object to be charged has been detected by the capacitor sensor, but to keep inactive each coil over which no object to be charged has been detected by the capacitor sensor.

11. The wireless power transmitter of any one of clauses 3 through 10, wherein the wireless power transmitter is configured to shut off a transmission coil upon detecting a foreign object over the transmission coil.

12. A wireless power transmission method comprising:
 charging each of a plurality of first lines and a plurality of second lines, the first and second lines overlying one or more transmission coils;
 monitoring a rate of discharge of each of the first and second lines, to determine the presence and location of an object proximate to one or more of the first and second lines; and
 operating the one or more transmission coils in response to the monitoring operation.

13. The method of clause 12, wherein monitoring the rate of discharge of each line comprises determining whether the line's voltage has reached a threshold after a predetermined length of time.

14. The method of clause 12, wherein monitoring the rate of discharge of each line comprises comparing the line's voltage with other lines' voltages after each line was discharging for a predetermined length of time.

15. The method of clause 12, wherein monitoring the rate of discharge of each line comprises determining a length of time taken by the line's voltage to reach a predetermined value.

16. The method of clause 12, wherein monitoring the rate of discharge of each line comprises comparing a length of time taken by the line's voltage to reach a predetermined value with lengths of time taken by other lines' voltages to reach the predetermined value.

17. The method of any one of clauses 12 through 16, wherein the charging comprises using a multiplexer circuit to connect each line being charged to a charge source; and monitoring the rate of discharge comprises coupling each line to a monitor circuit by the multiplexer circuit.

18. The method of any one of clauses 12 through 17, further comprising grounding the first lines during power transfer.

19. The method of any one of clauses 12 through 18, wherein the one or more transmission coils are a plurality of the transmission coils, and the method comprises performing power transfer by operating a transmission coil over which an object to be charged has been detected using said monitoring, but keeping inactive each transmission coil over which no object to be charged has been detected using the monitoring.

20. The method of any one of clauses 12 through 19, further comprising shutting off a transmission coil upon detecting a foreign object over the transmission coil.

21. A wireless power transfer apparatus comprising:

a receive coil for receiving a wireless signal and generating a corresponding AC signal;

circuitry coupling the receive coil to a terminal, for rectifying the AC signal and providing a rectified DC signal on the terminal (for example the circuitry can be IC 104C, possibly with drivers 708 and transistors 702, 704; the terminal can be VRECT);

wherein the circuitry is operable to monitor a capacitance in the receive coil as a function of a position of the receive coil relative to another object.

22. The apparatus of clause 21 wherein the apparatus is a wireless power receiver.

23. The apparatus of clause 21 or 22, wherein the other object is a transmit coil.

24. The apparatus of any one of claims 21 through 23, wherein monitoring the capacitance comprises applying a voltage to the receive coil and monitoring the voltage in the receive coil.

25. The apparatus of clause 24, wherein applying the voltage to the receive coil comprises applying a voltage to said terminal.

26. The apparatus of clause 25, wherein the circuitry comprises a rectifier comprising:

one or more transistors coupled between the receive coil and the terminal; and driver circuitry for driving the transistors; and applying the voltage to the receive coil comprises driving the transistors by the driver circuitry to the couple the voltage at said terminal to the receive coil.

27. The apparatus of any one of clausess 21 through 26, wherein the circuitry comprises a rectifier comprising:

one or more transistors coupled between the receive coil and the terminal; and driver circuitry for driving the transistors; and monitoring the capacitance comprises driving the transistors by the driver circuitry to apply a voltage to the receive coil, and monitoring the voltage in the receive coil.

The invention includes methods performed by apparatuses described above, and apparatuses configured to perform methods described above. The invention includes manufacturing techniques for manufacturing the apparatuses.

The above detailed description is provided to illustrate specific embodiments of the present invention and is not intended to be limiting. Numerous variations and modifications within the scope of the present invention are possible. The present invention is set forth in the following claims.

What is claimed is:

1. A wireless power transmitter comprising:

one or more transmission coils;

a capacitor sensor positioned over the one or more transmission coils and comprising:

first lines;

second lines intersecting the first lines;

a multiplexer circuit coupled to the first and second lines, the multiplexer circuit configured to provide a charge from a charge source to lines selected by the multiplexer circuit; and a monitor circuit for monitoring a rate of discharge of each of the first and second lines, the rate of discharge of each line depending on a presence of an object proximate to the line and on a charge transfer between the line and the object;

wherein the power transmitter is responsive to the monitor circuit in power transmission; and wherein the power transmitter is configured to ground the first lines during power transfer.

2. The wireless power transmitter of claim 1, wherein monitoring the rate of discharge of each line by the monitor circuit comprises determining whether the line's voltage has reached a threshold after a predetermined length of time.

3. The wireless power transmitter of claim 1, wherein monitoring the rate of discharge of each line by the monitor circuit comprises comparing the line's voltage with other lines' voltages after each line was discharging for a predetermined length of time.

4. The wireless power transmitter of claim 1, wherein monitoring the rate of discharge of each line by the monitor circuit comprises determining a length of time taken by the line's voltage to reach a predetermined value.

5. The wireless power transmitter of claim 1, wherein monitoring the rate of discharge of each line by the monitor circuit comprises comparing a length of time taken by the line's voltage to reach a predetermined value with lengths of time taken by other lines' voltages to reach the predetermined value.

6. The wireless power transmitter of claim 1, wherein the multiplexer circuit comprises:

a first multiplexer coupled to the first lines, to provide a charge from the charge source to the first lines selected by the first multiplexer and to couple selected first lines to the monitor circuit; and a second multiplexer coupled to the second lines, to provide a charge from the charge source to the second lines selected by the second multiplexer and to couple selected second lines to the monitor circuit.

7. The wireless power transmitter of claim 1, wherein the grounded first lines create an EMI filter shield to reduce radiated emission from at least one of the one or more transmission coils during power transfer.

8. The wireless power transmitter of claim 1, wherein the one or more transmission coils are a plurality of the transmission coils, wherein the transmitter is configured to perform power transfer by operating a transmission coil over which an object to be charged has been detected by the capacitor sensor, but to keep inactive each transmission coil over which no object to be charged has been detected by the capacitor sensor.

9. The wireless power transmitter of claim 1, wherein the wireless power transmitter is configured to shut off a transmission coil upon detecting a foreign object over the transmission coil.

10. The wireless power transmitter of claim 7 wherein the EMI filter shield is a comb filter.

11. A wireless power transmission method comprising:
charging each of a plurality of first lines and a plurality of second lines, the first and second lines overlying one or more transmission coils;
monitoring a rate of discharge of each of the first and second lines, to determine the presence and location of an object proximate to one or more of the first and second lines; and
operating the one or more transmission coils in response to the monitoring operation to perform wireless power transmission, and grounding the first lines during the wireless power transmission.

12. The method of claim 11, wherein monitoring the rate of discharge of each line comprises determining whether the line's voltage has reached a threshold after a predetermined length of time.

13. The method of claim 11, wherein monitoring the rate of discharge of each line comprises comparing the line's voltage with other lines' voltages after each line was discharging for a predetermined length of time.

14. The method of claim 11, wherein the one or more transmission coils are a plurality of the transmission coils, and the method comprises performing power transfer by operating a transmission coil over which an object to be charged has been detected using said monitoring, but keeping inactive each transmission coil over which no object to be charged has been detected using the monitoring.

15. The method of claim 11, wherein the grounded first lines create an EMI filter shield reducing radiated emission from at least one of the one or more transmission coils during the wireless power transmission.

16. The method of claim 11, wherein the grounded first lines create an EMI comb filter shield reducing radiated emission from at least one of the one or more transmission coils during the wireless power transmission.

17. The method of claim 11, further comprising shutting off a transmission coil upon detecting the object which is a foreign object proximate to the transmission coil.

* * * * *